US008878827B2

(12) United States Patent
Han et al.

(10) Patent No.: US 8,878,827 B2
(45) Date of Patent: Nov. 4, 2014

(54) ORGANIC LIGHT EMITTING DIODE DISPLAY

(75) Inventors: Sam-Il Han, Yongin (KR); Ji-Hyun Ka, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 484 days.

(21) Appl. No.: 13/116,849

(22) Filed: May 26, 2011

(65) Prior Publication Data

US 2012/0105388 A1 May 3, 2012

(30) Foreign Application Priority Data

Oct. 28, 2010 (KR) ........................ 10-2010-0106075

(51) Int. Cl.

| | |
|---|---|
| ***G06F 3/038*** | (2013.01) |
| ***G09G 5/00*** | (2006.01) |
| ***G09G 3/22*** | (2006.01) |
| ***G09G 3/32*** | (2006.01) |
| ***G09G 3/14*** | (2006.01) |
| ***G09G 3/36*** | (2006.01) |
| ***G09G 3/18*** | (2006.01) |
| ***H01L 27/32*** | (2006.01) |

(52) U.S. Cl.

CPC ........ *G09G 3/325* (2013.01); *G09G 2300/0861* (2013.01); *H01L 27/3276* (2013.01); *G09G 2310/0262* (2013.01)

USPC ................. 345/204; 345/76; 345/82; 345/39; 345/92; 345/52; 345/211

(58) Field of Classification Search

USPC .................... 345/204, 76, 82, 39, 92, 52, 211

See application file for complete search history.

(56) References Cited

U.S. PATENT DOCUMENTS

| | | | | |
|---|---|---|---|---|
| 2006/0007212 A1* | 1/2006 | Kimura et al. | ................ | 345/204 |
| 2006/0007218 A1* | 1/2006 | Miyake et al. | ................ | 345/204 |
| 2007/0046592 A1* | 3/2007 | Ono et al. | ....................... | 345/77 |
| 2007/0126666 A1* | 6/2007 | Yamazaki et al. | .............. | 345/76 |
| 2008/0211796 A1* | 9/2008 | Kim | ............................. | 345/204 |
| 2009/0135103 A1* | 5/2009 | Kim | ................................ | 345/76 |
| 2010/0007647 A1* | 1/2010 | Kubota | ........................ | 345/212 |

FOREIGN PATENT DOCUMENTS

| | | |
|---|---|---|
| KR | 10-2003-0010136 | 2/2003 |
| KR | 10-2003-0058148 | 7/2003 |

* cited by examiner

*Primary Examiner* — Aneeta Yodichkas

(74) *Attorney, Agent, or Firm* — Robert E. Bushnell, Esq.

(57) ABSTRACT

An organic light emitting diode (OLED) display includes: a switching thin film transistor including a switching gate electrode, a switching active layer, a switching source electrode, and a switching drain electrode; a driving thin film transistor including a driving gate electrode, a driving active layer, a driving source electrode, and a driving drain electrode; a capacitor including a first capacitor electrode and a second capacitor electrode; a scan line that is connected to the switching gate electrode of the switching thin film transistor; a data line that intersects the scan line and that is connected to the switching source electrode of the switching thin film transistor; a first power source line that is parallel to the data line and that is connected to the driving source electrode of the driving thin film transistor; a second power source line that is separated parallel to the data line and that is connected to the second capacitor electrode of the capacitor; and an organic light emitting diode that is connected to the driving drain electrode of the driving thin film transistor.

12 Claims, 5 Drawing Sheets

101
Cst
DATA VDD 158 138 VMOS OLED VDD DATA
145
710
T3
OLED
710
T2 135 154 134 136
EM[N]
148
SCAN[N]
159
T5
SCAN[N-1]
T4 VINT 132 151 131 133 T6 141
T1

ORGANIC LIGHT EMITTING DIODE DISPLAY

CLAIM OF PRIORITY

This application makes reference to, incorporates the same herein, and claims all benefits accruing under 35 U.S.C §119 from an application earlier filed in the Korean Intellectual Property Office on Oct. 28, 2010, and there duly assigned Serial No. 10-2010-0106075 by that Office.

BACKGROUND OF THE INVENTION

1. Field of the Invention

The described technology relates generally to an organic light emitting diode (OLED) display. More particularly, the described technology relates generally to an OLED display that suppresses generation of parasitic capacitance.

2. Description of the Related Art

An OLED display includes a plurality of thin film transistors, a capacitor, a scan line, a data line, one or more power source line, etc., in order to drive an OLED in each pixel.

However, when one electrode of the capacitor or a power source line that is connected to one electrode of the capacitor is overlapped with a data line, unnecessary parasitic capacitance generates and becomes a cause of a failure.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an OLED display having advantages of preventing generation of unnecessary parasitic capacitance between a data line and a capacitor.

An exemplary embodiment provides an organic light emitting diode (OLED) display including: a switching thin film transistor including a switching gate electrode, a switching active layer, a switching source electrode, and a switching drain electrode; a driving thin film transistor including a driving gate electrode, a driving active layer, a driving source electrode, and a driving drain electrode; a capacitor including a first capacitor electrode and a second capacitor electrode; a scan line that is connected to the switching gate electrode of the switching thin film transistor; a data line that intersects the scan line and that is connected to the switching source electrode of the switching thin film transistor; a first power source line that is parallel to the data line and that is connected to the driving source electrode of the driving thin film transistor; a second power source line that is separated parallel to the data line and that is connected to the second capacitor electrode of the capacitor; and an organic light emitting diode that is connected to the driving drain electrode of the driving thin film transistor.

The second capacitor electrode may be overlapped with a part of the second power source line and may be not overlapped with the data line.

The switching drain electrode of the switching thin film transistor may be connected to the first power source line and the driving source electrode of the driving thin film transistor. The driving gate electrode of the driving thin film transistor may be connected to the first capacitor electrode of the capacitor.

The switching active layer, the driving active layer, and the first capacitor electrode may be formed in the same layer.

The switching source electrode, the switching drain electrode, the driving source electrode, and the driving drain electrode may be formed in the same layer as the switching active layer and may be formed using polysilicon.

The switching gate electrode, the driving gate electrode, the scan line, and the second capacitor electrode may be formed in the same layer and may be formed on the switching active layer, the driving active layer, and the first capacitor electrode with an insulating film interposed therebetween.

The data line, the first power source line, and the second power source line may be formed in the same layer and may be formed on the switching gate electrode, the driving gate electrode, the scan line, and the second capacitor electrode with an insulating film interposed therebetween.

The second capacitor electrode and the second power source line may be connected through a contact hole that is formed in an area in which the second capacitor electrode and the second power source line are overlapped.

The OLED display may further include a plurality of additional thin film transistors.

The OLED display may further include a control line that is connected to a part of the plurality of additional thin film transistors and that is formed parallel in the same layer as that of the scan line.

The OLED display may further include an additional scan line that is connected to a part of the plurality of additional thin film transistors and that is formed parallel in the same layer as that of the scan line.

The OLED display may further include an internal voltage line that is connected to a part of the plurality of additional thin film transistors and that is formed parallel in the same layer as that of the scan line.

According to an exemplary embodiment, the OLED display can prevent unnecessary parasitic capacitance from generating between the data line and the capacitor.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
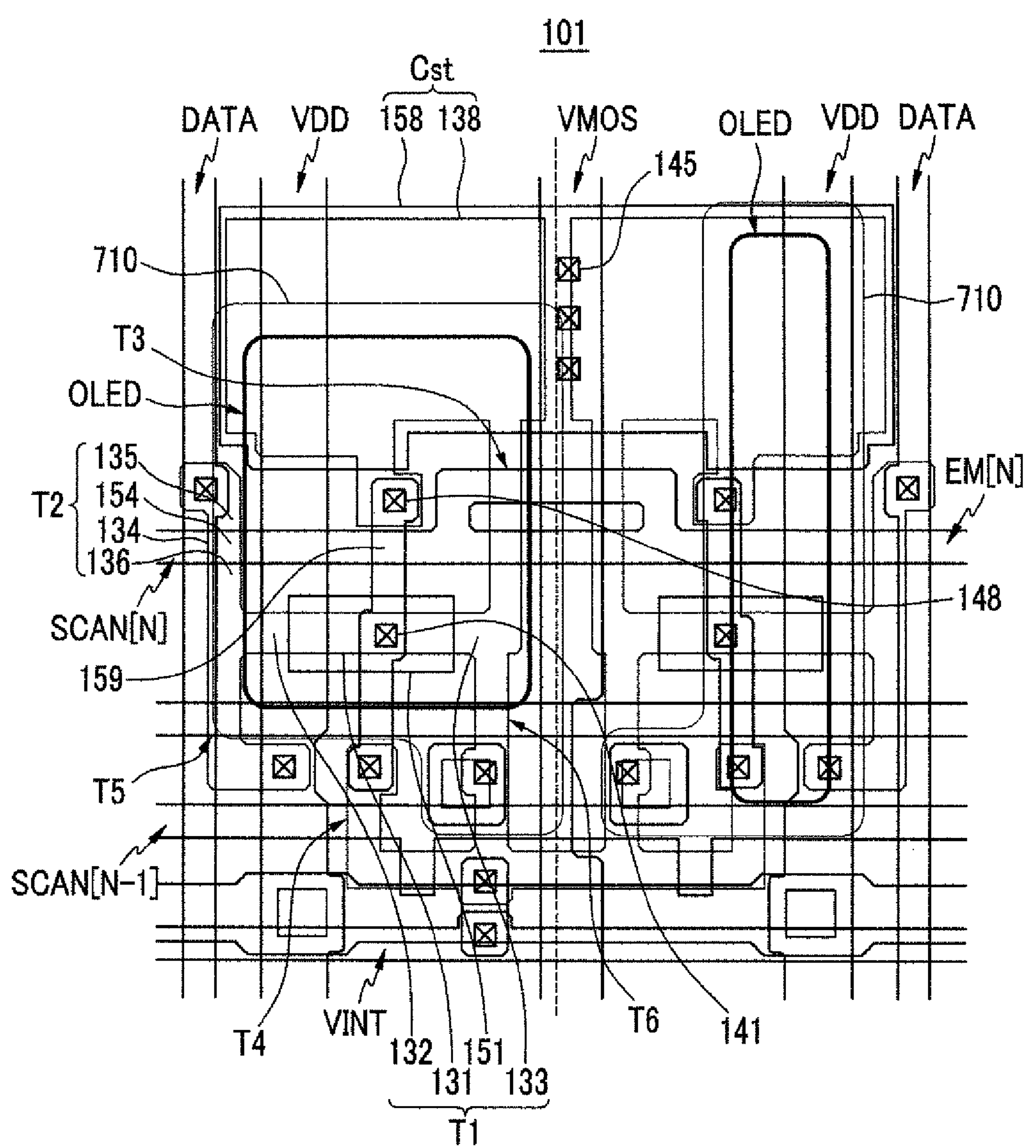
FIG. 1 is a layout view illustrating a pixel of an OLED display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, like reference numerals designate like elements throughout the specification.

Further, in the drawings, a size and thickness of each element are randomly represented for better understanding and ease of description, and the present invention is not limited thereto.

Further, it will be understood that when an element such as a layer, film, region, or substrate is referred to as being "on" another element, it can be directly on the other element or intervening elements may also be present.

Hereinafter, an OLED display 101 according to a first exemplary embodiment will be described with reference to FIGS. 1 and 2.

FIG. 1 is a layout view illustrating a pixel of an OLED display 101 according to an exemplary embodiment. Here, a pixel is a minimum unit in which the OLED display 101 displays an image. FIG. 1 illustrates a pair of pixels having an opposite structure. In FIG. 1, a dotted line represents a boundary between a pair of pixels. FIG. 2 is an equivalent circuit diagram illustrating the pixel of FIG. 1.

Figure 2:
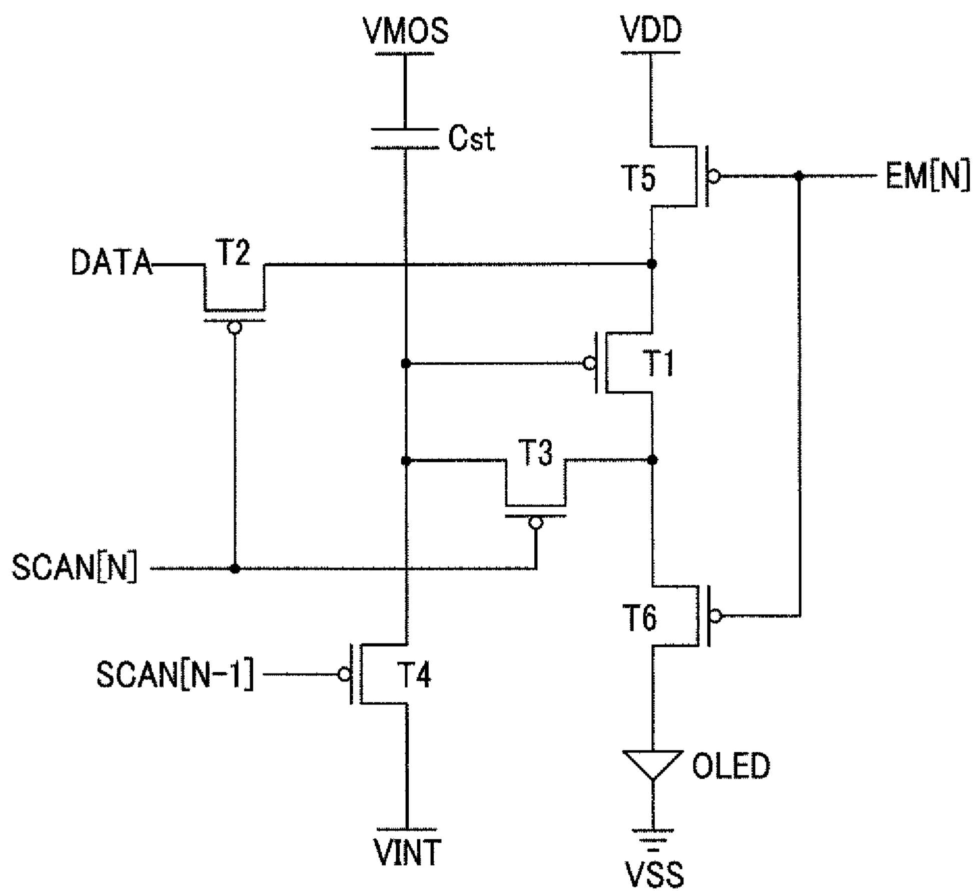
FIG. 2 is an equivalent circuit diagram illustrating the pixel of FIG. 1.

As shown in FIGS. 1 and 2, the OLED display 101 according to a first exemplary embodiment includes a driving thin film transistor T1, a switching thin film transistor T2, a capacitor Cst, a scan line SCAN[N], a data line DATA, a first power source line VDD, a second power source line VMOS, and an OLED that are formed in each pixel.

The driving thin film transistor T1 includes a driving gate electrode 151, a driving active layer 131, a driving source electrode 132, and a driving drain electrode 133. The switching thin film transistor T2 includes a switching gate electrode 154, a switching active layer 134, a switching source electrode 135, and a switching drain electrode 136. The capacitor Cst includes a first capacitor electrode 138 and a second capacitor electrode 158.

The switching gate electrode 154 of the switching thin film transistor T2 is connected to the scan line SCAN[N]. The switching source electrode 135 of the switching thin film transistor T2 is connected to the data line DATA. The scan line SCAN[N] and the data line DATA are formed to cross each other. The switching drain electrode 136 of the switching thin film transistor T2 is connected to the first power source line VDD and the driving source electrode 132 of the driving thin film transistor T1. Therefore, the driving source electrode 132 of the driving thin film transistor T1 is connected to the first power source line VDD. The driving gate electrode 151 of the driving thin film transistor T1 is connected to the first capacitor electrode 138 of the capacitor Cst. The second capacitor electrode 158 of the capacitor Cst is connected to the second power source line VMOS. The first power source line VDD and the second power source line VMOS are each formed parallel to the data line DATA. The driving drain electrode 133 of the driving thin film transistor T1 is connected to the OLED. The OLED emits light according to a signal that is received from the driving thin film transistor T1.

In an exemplary embodiment, the data line DATA and the second power source line VMOS are formed parallel and are not overlapped. Further, the capacitor Cst including the second capacitor electrode 158 that is connected to the second power source line VMOS is not overlapped with the data line DATA.

Therefore, according to an exemplary embodiment, unnecessary parasitic capacitance can be prevented from generating between the data line DATA and the first capacitor electrode 138 of the capacitor Cst or the second power source line VMOS that is connected to the first capacitor electrode 138.

The above-described configurations are essential configurations in the OLED display 101 according to an exemplary embodiment. However, an exemplary embodiment is not limited to the above-described configurations. Therefore, the OLED display 101 may further include a plurality of additional thin film transistors T3, T4, T5, and T6, a control line EN, an internal voltage line VINT, and an additional scan line SCAN[N−1].

The control line EN[N], the internal voltage line VINT, and the additional scan line SCAN[N−1] are each connected to a part of a plurality of additional thin film transistors T3, T4, T5, and T6 and are formed parallel to the scan line SCAN[N].

Further, the OLED display 101 has a structure in which three conductive layer patterns are stacked, except for a layer in which the OLED is formed.

Hereinafter, the OLED display 101 of FIG. 1 will be described in detail on a stacking order basis with reference to FIGS. 3 to 5.

Figure 3:
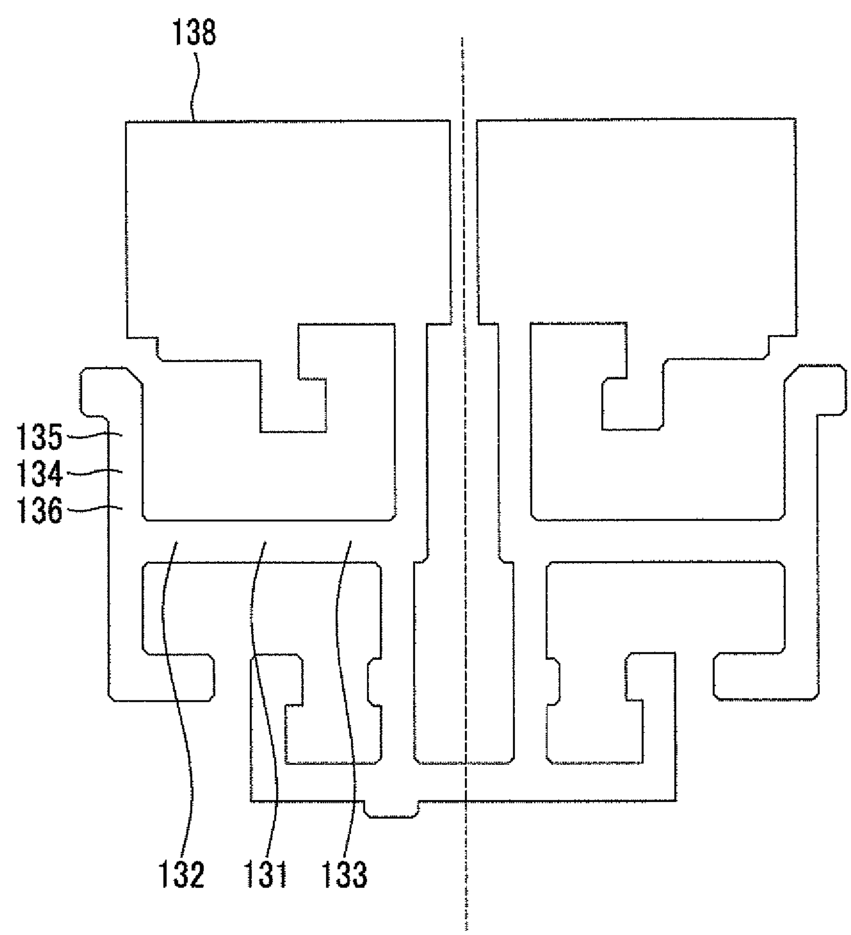
FIGS. 3 to 5 are layout views of an OLED display according to a stacking order.

As shown in FIG. 3, the driving active layer 131, the switching active layer 134, and the first capacitor electrode 138 are formed. That is, the driving active layer 131, the switching active layer 134, and the first capacitor electrode 138 are formed using the same material in the same layer. Further, in an exemplary embodiment, the driving source electrode 132, the driving drain electrode 133, the switching source electrode 135, and the switching drain electrode 136 are also formed using the same material in the same layer as the driving active layer 131, the switching active layer 134, and the first capacitor electrode 138. Hereinafter, the driving active layer 131, the driving source electrode 132, the driving drain electrode 133, the switching active layer 134, the switching source electrode 135, the switching drain electrode 136, and the first capacitor electrode 138 are referred to as a semiconductor layer pattern.

The semiconductor layer pattern is formed by patterning a polysilicon film. However, impurities are doped in the driving source electrode 132, the driving drain electrode 133, the switching source electrode 135, and the switching drain electrode 136 of the semiconductor layer pattern, and they become a conductor. In this case, as impurities are doped in the driving active layer 131 and the switching active layer 134, it is prevented that the driving gate electrode 151 and the switching gate electrode 154 that are formed on the driving active layer 131 and the switching active layer 134, respectively, become a conductor.

The impurities may be P-type impurities including elements such as aluminum, boron, gallium, and indium. However, an exemplary embodiment is not limited thereto and in some case, N-type impurities may be doped.

Figure 4:
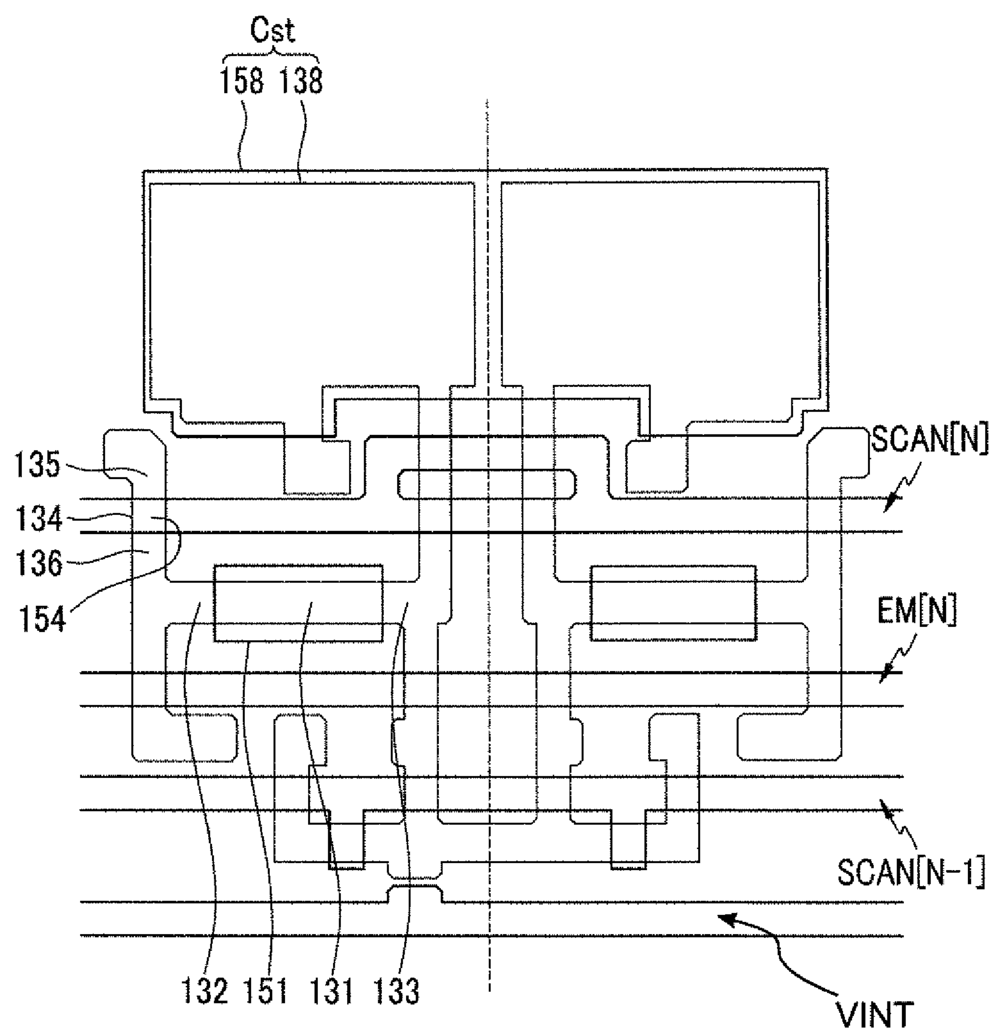

As shown in FIG. 4, on the semiconductor layer pattern, the driving gate electrode 151, the switching gate electrode 154, the scan line SCAN[N], and the second capacitor electrode 158 are formed with an insulating film interposed therebetween. That is, the driving gate electrode 151, the switching gate electrode 154, the scan line SCAN[N], and the second capacitor electrode 158 are formed using the same material in the same layer. Hereinafter, the driving gate electrode 151, the switching gate electrode 154, the scan line SCAN[N], and the second capacitor electrode 158 are referred to as a gate wire. Further, the gate wire may include a control line EN[N], an internal voltage line VINT, and an additional scan line SCAN [N−1]. The gate wire is formed by patterning a metal film.

The metal film includes at least one of various metallic materials that are well known to a person of ordinary skill in the art, such as molybdenum (Mo), chromium (Cr), aluminum (Al), silver (Ag), titanium (Ti), tantalum (Ta), and tungsten (W).

The insulating film includes at least one of various insulating materials that are well known to a person of ordinary skill in the art, including various organic films or an inorganic film such as tetra ethyl ortho silicate (TEOS), silicon nitride (SiNx), and silicon oxide ($SiO_2$).

The driving gate electrode 151 is overlapped with the driving active layer 131, and the switching gate electrode 154 is overlapped with the switching active layer 134. The second capacitor electrode 158 is overlapped with the first capacitor electrode 138. An insulating film between the second capacitor electrode 158 and the first capacitor electrode 138 becomes a dielectric material.

Figure 5:
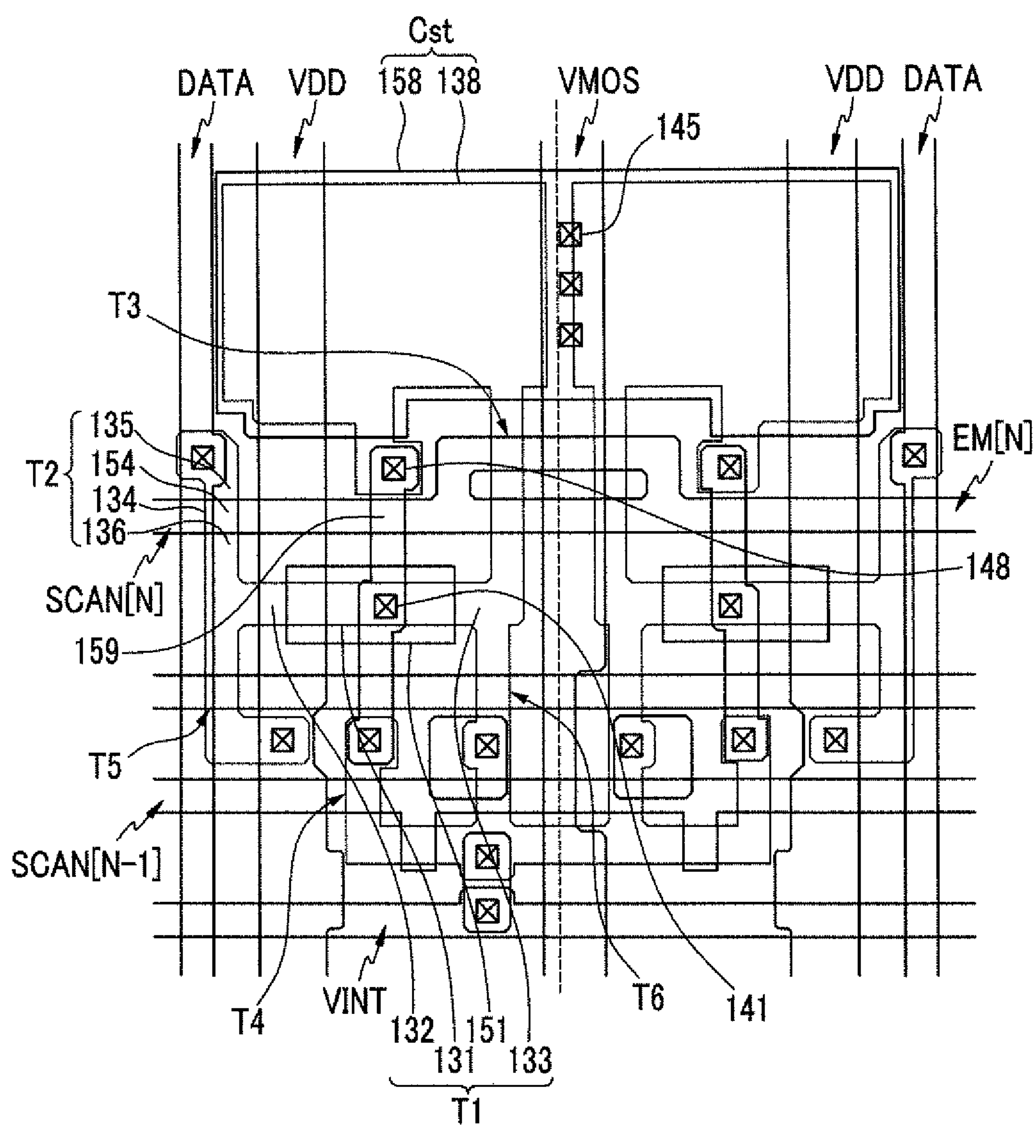

As shown in FIG. 5, on a gate wire, the data line DATA, the first power source line VDD, and the second power source line VMOS are formed with an insulating film interposed therebetween. That is, the data line DATA, the first power source line VDD, and the second power is source line VMOS are formed using the same material in the same layer. Hereinafter, the data line DATA, the first power source line VDD, and the second power source line VMOS are referred to as a data wire. Further, the data wire may further include a connection line 159 that connects the first capacitor electrode 138 and the driving gate electrode 151. The data wire is formed by patterning a metal film.

A part of the second power source line VMOS is overlapped with the second capacitor electrode 158. The second power source line VMOS and the data line DATA are separated from each other, and the data line DATA is not overlapped with the second capacitor electrode 158. A contact hole 145 is formed in an area in which the second power source line VMOS and the second capacitor electrode 158 are overlapped. The second power source line VMOS and the second capacitor electrode 158 are connected through the contact hole 145. Further, contact holes 141 and 148 for connecting the connection line 159 to each of the first capacitor electrode 138 and the driving gate electrode 151 are formed. These contact holes 141, 145, and 148 are formed before a data wire is formed.

As shown in FIG. 1, the OLED is formed on a data wire. An electrode 710 of the OLED is connected to the driving drain electrode 133.

The electrode 710 of the OLED is formed with a transparent conductive layer, and the OLED display 101 may further include other wires that are made of the same material in the same layer as that of the electrode 710 of the OLED.

The transparent conductive layer includes at least one of indium tin oxide (ITO), indium zinc oxide (IZO), zinc indium tin oxide (ZITO), gallium indium tin oxide (GITO), indium oxide (In2O3), zinc oxide (ZnO), gallium indium zinc oxide (GIZO), gallium zinc oxide (GZO), fluorine tin oxide (FTO), and aluminum-doped zinc oxide (AZO).

The OLED includes an electrode that injects holes, an electrode that injects electrons, and an organic emission layer that is disposed between both electrodes. When holes and electrons are injected into the organic emission layer and excitons in which the injected holes and electrons are coupled drop from an exited state to a ground state, light is emitted.

Further, the switching thin film transistor T2 selects a pixel to emit light, and the driving thin film transistor T1 applies a driving signal for allowing the OLED to emit light within the selected pixel to the OLED.

By such a configuration, the OLED display 101 according to an exemplary embodiment can prevent unnecessary parasitic capacitance from generating between the data line DATA and the capacitor Cst in a structure in which the first power source line VDD and the second power source line VMOS are separated.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:

a switching thin film transistor comprising a switching gate electrode, a switching active layer, a switching source electrode, and a switching drain electrode;

a driving thin film transistor comprising a driving gate electrode, a driving active layer, a driving source electrode, and a driving drain electrode;

a capacitor comprising a first capacitor electrode and a second capacitor electrode;

a scan line that is connected to the switching gate electrode of the switching thin film transistor;

a data line that intersects the scan line and that is connected to the switching source electrode of the switching thin film transistor;

a first power source line that is parallel to the data line and that is connected to the driving source electrode of the driving thin film transistor;

a second power source line that is separated parallel to the data line and that is connected to the second capacitor electrode of the capacitor; and an organic light emitting diode that is connected to the driving drain electrode of the driving thin film transistor.

2. The OLED display of claim 1, wherein the second capacitor electrode is overlapped with a part of the second power source line and is not overlapped with the data line.

3. The OLED display of claim 2, wherein the switching drain electrode of the switching thin film transistor is connected to the first power source line and the driving source electrode of the driving thin film transistor, and the driving gate electrode of the driving thin film transistor is connected to the first capacitor electrode of the capacitor.

4. The OLED display of claim 2, wherein the switching active layer, the driving active layer, and the first capacitor electrode are formed in the same layer.

5. The OLED display of claim 4, wherein the switching source electrode, the switching drain electrode, the driving source electrode, and the driving drain electrode are formed in the same layer as the switching active layer and are formed using polysilicon.

6. The OLED display of claim 4, wherein the switching gate electrode, the driving gate electrode, the scan line, and the second capacitor electrode are formed in the same layer and are formed on the switching active layer, the driving active layer, and the first capacitor electrode with an insulating film interposed therebetween.

7. The OLED display of claim 6, wherein the data line, the first power source line, and the second power source line are formed in the same layer and are formed on the switching gate electrode, the driving gate electrode, the scan line, and the second capacitor electrode with an insulating film interposed therebetween.

8. The OLED display of claim 7, wherein the second capacitor electrode and the second power source line are connected through a contact hole that is formed in an area in which the second capacitor electrode and the second power source line are overlapped.

9. The OLED display of claim 1, further comprising a plurality of additional thin film transistors.

10. The OLED display of claim 9, further comprising a control line that is connected to a part of the plurality of additional thin film transistors and that is formed parallel in the same layer as that of the scan line.

11. The OLED display of claim 9, further comprising an additional scan line that is connected to a part of the plurality of additional thin film transistors and that is formed parallel in the same layer as that of the scan line.

12. The OLED display of claim 9, further comprising an internal voltage line that is connected to a part of the plurality of additional thin film transistors and that is formed parallel in the same layer as that of the scan line.

* * * * *